United States Patent [19]

Johnson

[11] 4,450,960
[45] May 29, 1984

[54] PACKAGE

[75] Inventor: Douglas M. Johnson, Chanhassen, Minn.

[73] Assignee: Empak Inc., Chanhassen, Minn.

[21] Appl. No.: 412,980

[22] Filed: Aug. 30, 1982

[51] Int. Cl.³ .............................................. B65D 85/48
[52] U.S. Cl. .................................... 206/334; 206/454; 206/508; 206/586
[58] Field of Search ............... 206/454, 455, 309, 332, 206/334, 586, 205, 444, 445, 508

[56] References Cited

U.S. PATENT DOCUMENTS

| | | | |
|---|---|---|---|
| 3,961,877 | 6/1976 | Johnson | 206/454 |
| 4,000,704 | 1/1977 | Griffin, Jr. | 206/511 |
| 4,042,107 | 8/1977 | Kendig | 206/511 |
| 4,043,451 | 8/1977 | Johnson | 206/454 |
| 4,061,227 | 12/1977 | Olbres | 206/454 |
| 4,061,228 | 12/1977 | Johnson | 206/454 |
| 4,091,919 | 5/1978 | MacLeod et al. | 206/454 |
| 4,171,740 | 10/1979 | Clement et al. | 206/454 |
| 4,248,346 | 2/1981 | Johnson | 206/454 |

*Primary Examiner*—Joseph Man-Fu Moy
*Attorney, Agent, or Firm*—Hugh D. Jaeger

[57] ABSTRACT

Container package for transporting a plurality of silicon wafers for shipment as well as preventing contamination thereof. The container wafer package includes a cassette having two sides, an end, and an H-bar including an upper ramp support and a lower round support with the bar being reinforced by a partially cylindrical rod, a package bottom including four sides, a female trough surrounding the sides, hook latches, four internal side dividing members, and orthogonal feet for stacking; and the package top including four sides, a male trough to mate with the female trough, configured independent flexible grooved fingers, and orthogonal feet for stacking where the cassette is positioned by internal side dividers in the top and bottom packages for secure placement. The three components provide that the cassette mates between the top and bottom packages, the wafers mate in the cassette and with the top fingers, the top and bottom packages mate between the trough, and the hook ends secure the top and bottom packages together with also securing of the cassette and wafers therein. The side of the package is smooth, providing for a flush perimeter for taping. The interlocking orthogonal pairs of feet on each corner provide for stacking of like packages. The smooth, rounded contour design of the package provides a design for shrink wrapping. The package limits and prohibits wafer movement, and eliminates wafer breakage.

21 Claims, 10 Drawing Figures

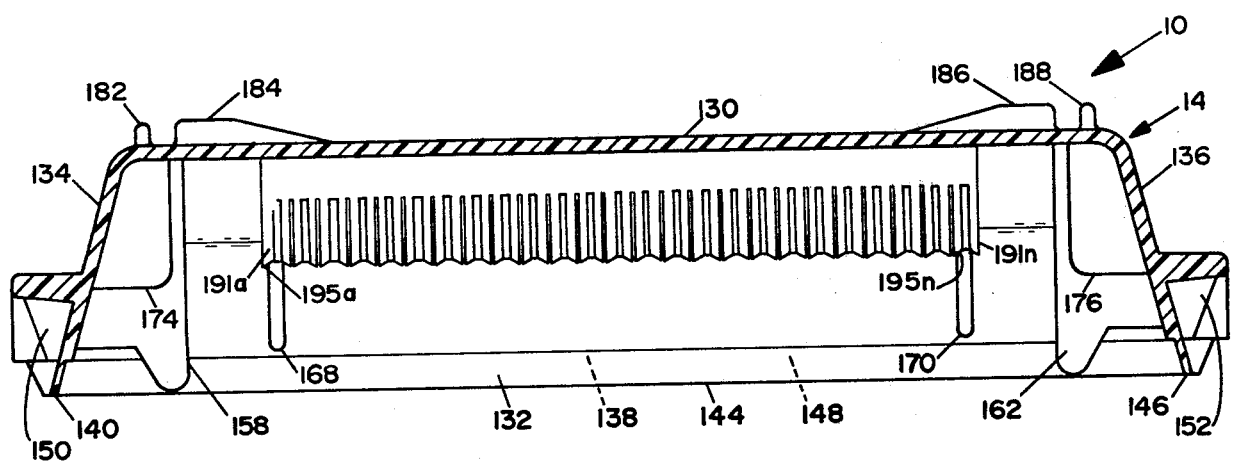
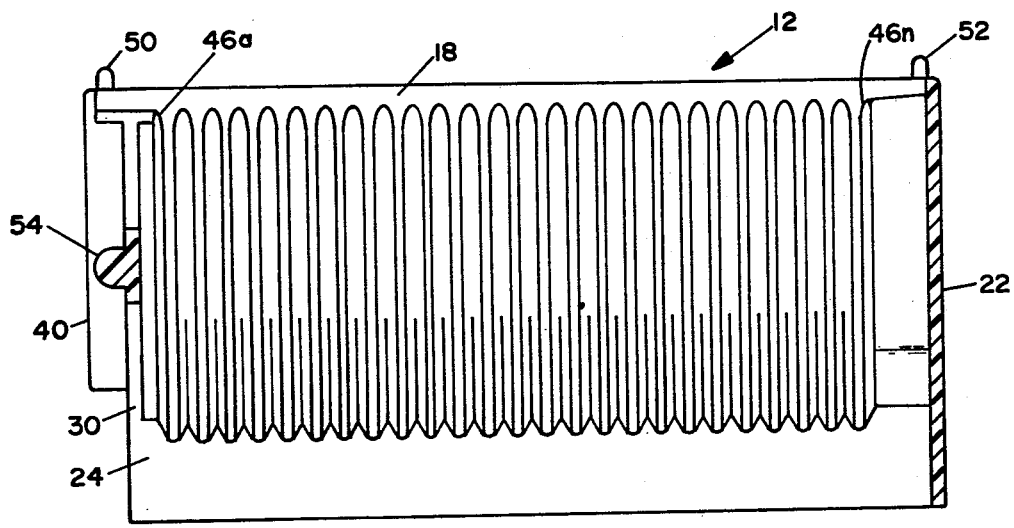
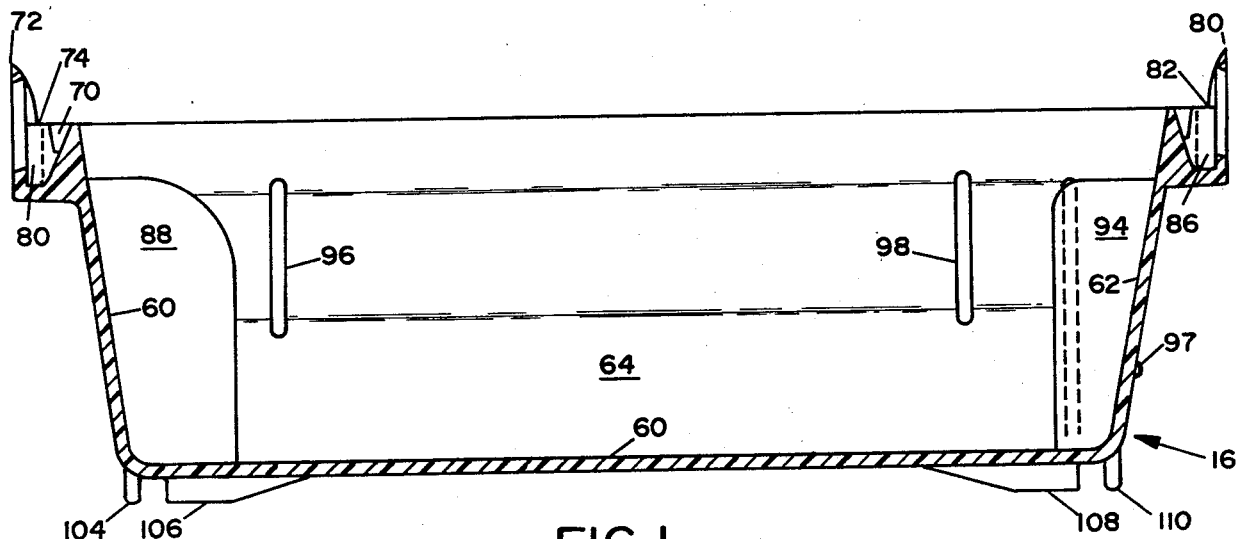
FIG. 1

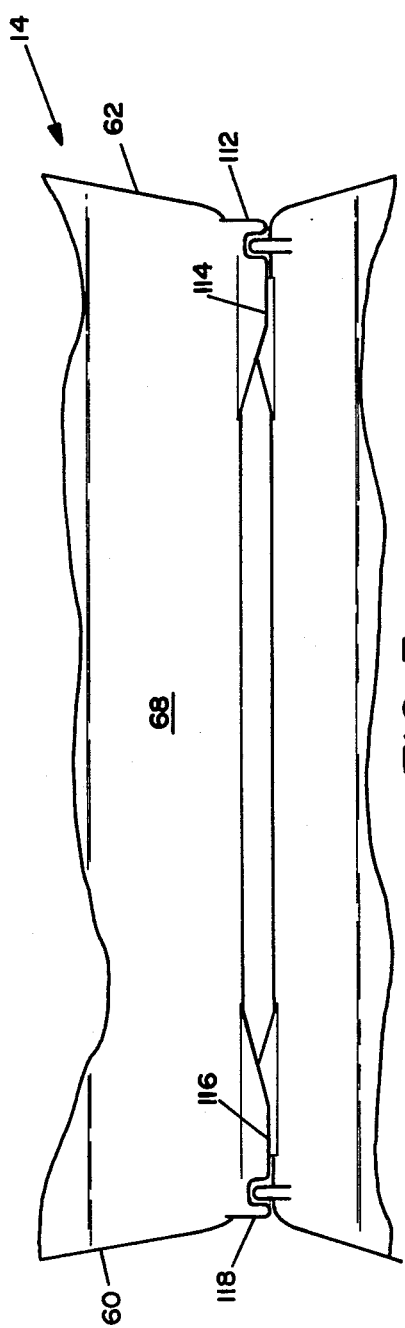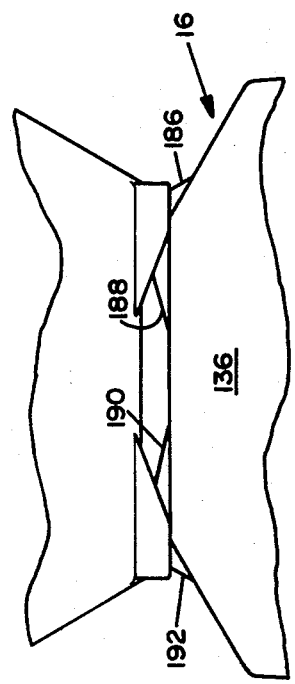

1

PACKAGE

BACKGROUND OF THE INVENTION

1. Field of the Invention

The present invention relates to a package and container and, more particularly, pertains to a contourized silicon wafer package for transporting and storage of silicon wafers by a three-component cassette, top, and bottom package.

2. Description of the Prior Art

The prior art packages for shipment and storage of silicon wafers have exhibited certain deficiencies throughout the course of utilization of silicon wafers for the processing into integrated circuits.

One of the deficiencies of the prior art was a secure cassette for not only holding and transporting the wafers, but for subsequent placement in wafer processing machinery and wafer transfer for processing such as through airflow, suction, or rubber belt. The cassettes would usually be lacking in strength and would not be particularly supportive at the end while the wafers were being removed from the cassette. This caused damage to the silicon wafers as well as lost time and motion and breaking of the cassettes with wafers therein.

Another deficiency of the prior art was a storage box which secured the wafer in a closed environment and could withstand the rigors of the transportation industry, whether by motor freight or by air freight. The prior art containers did not exist to provide for an uncontaminated environment, the packages were not smooth, and the cassettes were not provided for usually interlocking and interengaging with other portions of the package. Consequently, packages were cause for contamination and breakage of the wafers during shipment or storage.

The present invention overcomes the disadvantages of the prior art by providing a package providing for shipment of silicon wafers including components of a cassette, a package top, and a package bottom which interlock and interengage with respect to each other including a plurality of wafers in the cassette, providing for a safe, uncontaminated and flush perimeter package in addition to securing of the wafer in the cassette with the cassette and wafers secured between the bottom package and the top package.

SUMMARY OF THE INVENTION

The general purpose of the present invention is to provide a contourized package for silicon wafers during transportation and storage where the package includes a number of projections for engaging and encompassing the silicon wafer through the interaction or the three components of the cassette, package top and package bottom.

According to one embodiment of the present invention, there is provided a yield guard silicon wafer package including in combination, a wafer cassette including opposing mirror-image curved sides, a closed end, and an open H-bar configured end including a ramp top portion and a rounded bottom portion, a partial cylindrical member secured across the H-bar, and two vertical sides at either end of the bar; a package bottom including a bottom, four slightly curved sides, a female trough surrounding the sides, a hook latch with a finger hole and two hooks on either side of each of the finger holes, internal vertical side and end positioning members, and four pairs of orthogonal feet at each edge, and, a package top including a top member, four sides surrounding the top, a male lip for mating with the female trough, a plurality of opposing flexible grooved fingers including a side groove and top groove in each of the fingers for independently mating the circumference of each wafer positioned between outwardly extending dividers from the sides of the cassette, side positioning members extending outwardly from the interior of the sides and ends, hole indentations positioned on the outer ends for receiving of the hooks of the latches from the package bottom, indentations in the center of each end corresponding to the finger hole, and a plurality of orthogonal pairs of feet on each outer corner of the package top whereby a silicon wafer is engaged between the dividers of the cassette, and also between the cassette and the fingers of the package top, the cassette engages and interlocks between the vertical side and end members between the package top and package bottom, the package top lip engages into the package bottom trough, and the latches engage over the hook ends between the bottom and top packages respectively, and the interlocking orthogonal feet providing for stacking of like packages in storage thereby assuring a secure and contamination-free environment for transportation and storage of wafers and a rounded, contoured package for heat-shrink wrapping.

One significant aspect and feature of the present invention is a package for transporting and storage of silicon wafers. The package provides a perimeter-free edge for taping the like as well as interlocking between the bottom and top of the package. The package also provides for interlocking and engagement of the cassette so as to prevent damage or possible movement of the wafers and cassette during transportation.

Another significant aspect and feature of the present invention is a silicon wafer cassette which can be placed into automatic processing machinery for wafer removal processing by either air suction or rubberband endless loops, and provides for a secure and safe cassette through a reinforced H-bar construction. The H-bar construction includes a ramped top, a round bottom, a reinforced H-bar with a partial cylinder, and two vertical outwardly extending side members.

A further significant aspect and feature of the present invention is orthogonally positioned feet at each corner of the package, providing for interlocking stacking of the boxes.

An additional significant aspect and feature of the present invention is a package which is also designed without sharp edges but a rounded contour on the exterior so that a polyethylene, mylar or similar film may be shrink-wrapped around it to prevent contamination and/or infiltration of dirt or air.

Another significant aspect and feature of the present invention is a package top including a plurality of independently grooved fingers which are independently flexible of each other, which provides for independent movement on engaging of a wafer and which expand outwardly, positioning the wafer within the cassette and providing for positioning of the wafers within the cassette bottom. The fingers have an angle when engaged against the cassette and also provide an upward pressure for popping open the top when the hook latches are moved away from the latch, thereby in effect automatically opening the package top from the package bottom. The fingers provide a twofold purpose in not only securing the wafers but in also assisting in opening the package top. The wafers first intersect a V-center of the fingers and then ride in the groove of the fingers which are flexible with respect to the wafer and each other. The fingers also provide uniform spacing of each wafer in the cassette.

Having thus described one embodiment of the present invention, it is a principal object hereof to provide a contourized silicon wafer package designed to deliver clean, uncontaminated silicon wafers for the integrated circuit industry.

One object of the present invention is to provide wafers in a cassette and package providing stability as well as non-contaminability and structural integrity of each wafer in the cassette.

Another object of the present invention is to provide a package which maintains low level of particulate contamination providing for the highest quality substrates.

A further object of the present invention is to provide a cassette which is reusable as well as having H-bar construction providing compatibility with wafer processing equipment. During the course of processing of the wafer, the cassette can be utilized until the wafer becomes a plurality of micro-electronic chips. The cassette is suitable for end use by the customer.

An additional object of the present invention is to provide a silicon wafer package with fingers which space the wafers with respect to each other, secure the wafers within the cassette, and also provide upward force due to the spring action of each finger popping off the top when the hook latches are removed thereby providing for smooth and easy action of removing the package top from the package bottom.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference numerals designate like parts throughout the figures thereof and wherein:

FIG. 1 illustrates a cross-sectional side view of a package including three separated components from top to bottom in order of a package top, a wafer cassette, and a package bottom;

FIG. 3A illustrates interlocking feet between a package top and a package bottom side;

FIG. 3B illustrates interlocking feet between a package top and a package bottom end view;

DESCRIPTION OF PREFERRED EMBODIMENTS

Figure 2:
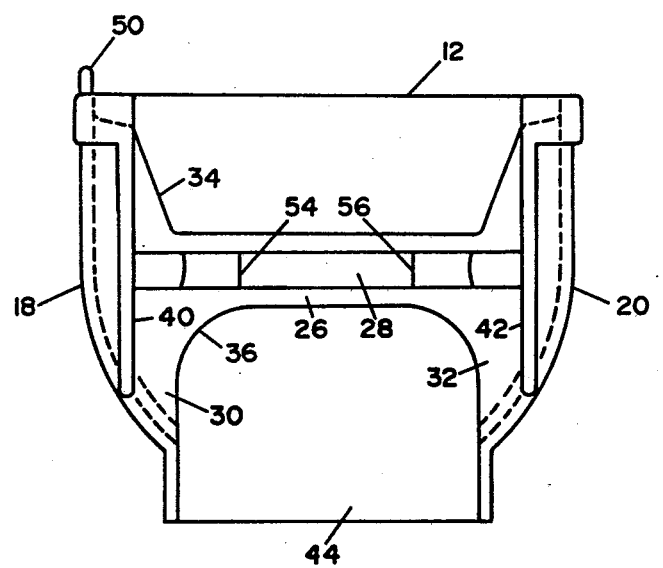
FIG. 2 illustrates an end view of the open end of the H-bar construction of the cassette.

FIG. 1, which illustrates a cross-sectional side view of a wafer package 10, shows the three components of a cassette 12, package top 14, and package bottom 16 separated and in alignment with respect to each other. For purposes of reference, FIG. 5 shows the three components 12-16 assembled in a cross-sectional view. Reference is now made to FIGS. 1-5 in the following discussion with reference particularly to FIG. 1.

The cassette 12 includes geometrically configured opposing right and left mirror-image sides 18 and 20, a closed planar end 22, and an open H-bar end 24 including a configured H flat member 26, a rounded partial rod cylindrical support 28, a right vertical support 30 and a left vertical support 32, a ramped top portion 34, a rounded bottom portion 36, and downwardly extending left and right ribs 40 and 42 in a substantially vertical plane forming thereabout a gate area 44. A plurality of vertically opposing outwardly extending dividers 46a-46n and 48a-48n partition the cassette 12 for encompassing a plurality of wafers such as silicon wafers or the like. Locating pins 50 and 52 are provided for wafer transfer in the cassette 12. Buttons 54 and 56 are provided on the rounded support 28 or the cylindrical rod 26 can also be continuous.

Figure 4:
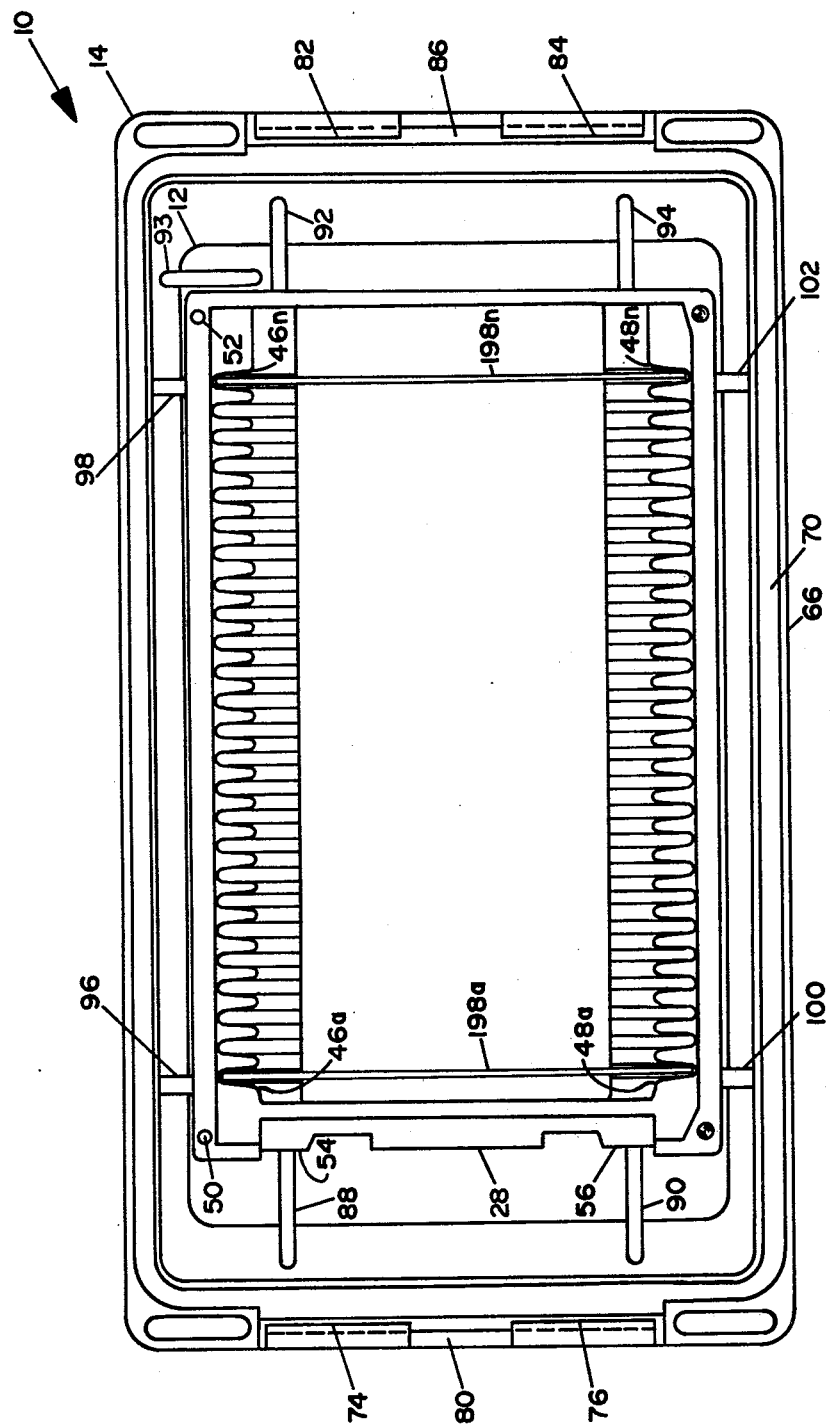
FIG. 4 illustrates a view down into showing the mating of a cassette into a package bottom.
Figure 5:
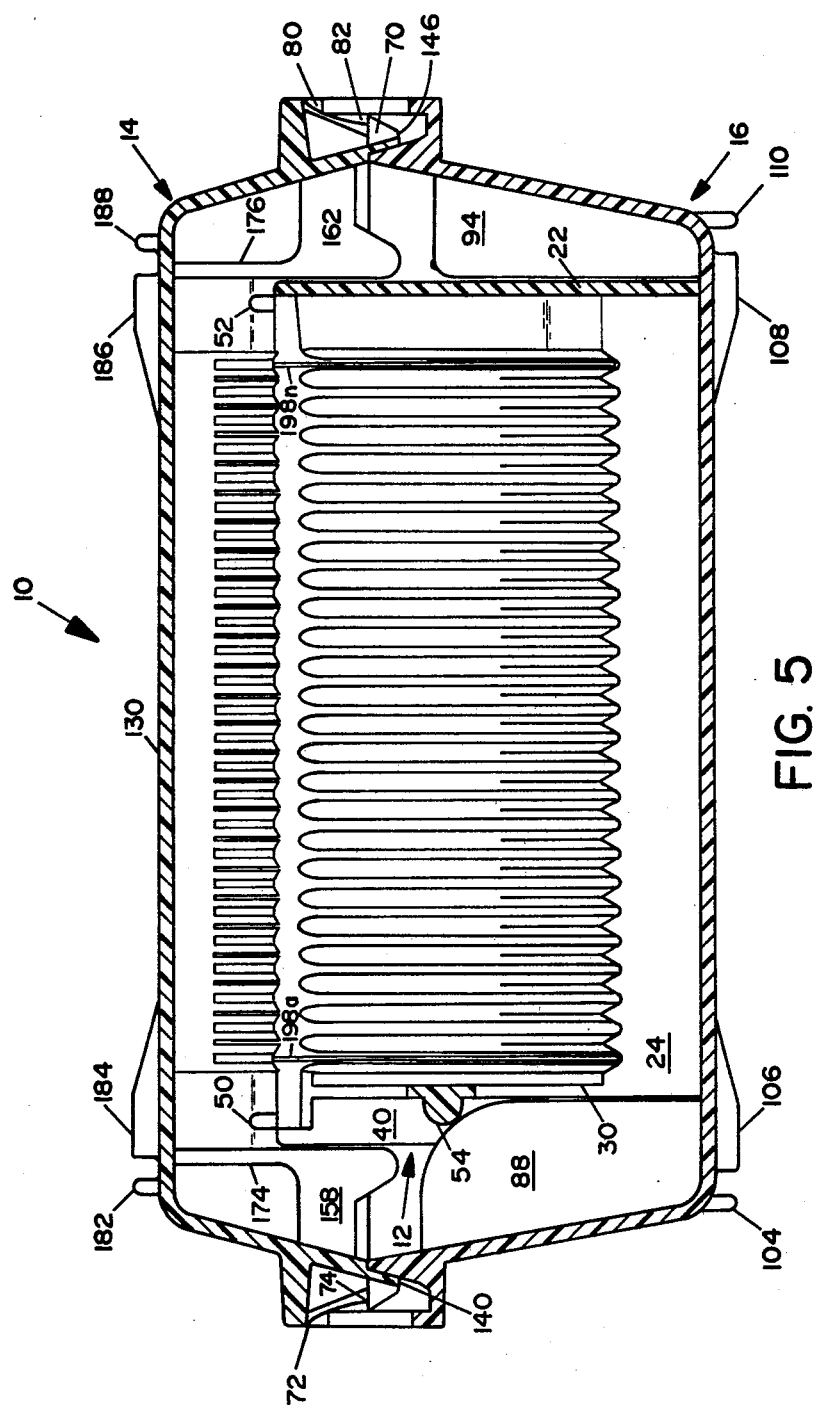
FIG. 5 illustrates a cross-sectional view of an interlocked and engaged cassette, package bottom and package top.

The package bottom 16 includes a planar bottom 60, four rectangular sides 60, 62, 64 and 68, a female configured four-sided trough 70, a hook latch 72 including hooks 74 and 76 with finger holes 78, and hook latch 80 with hooks 82 and 84 and finger hole 86, four end guides 88, 90, 92 and 94, and four side guides 96, 98, 100, and 102 of FIG. 4. The end guides 88 and 90 are curved for alignment with sides 30 and 32. Four pairs of orthogonal feet position on the corners, including feet 104 and 106, 108 and 110, 112 and 114, 116 and 118.

Figure 6:
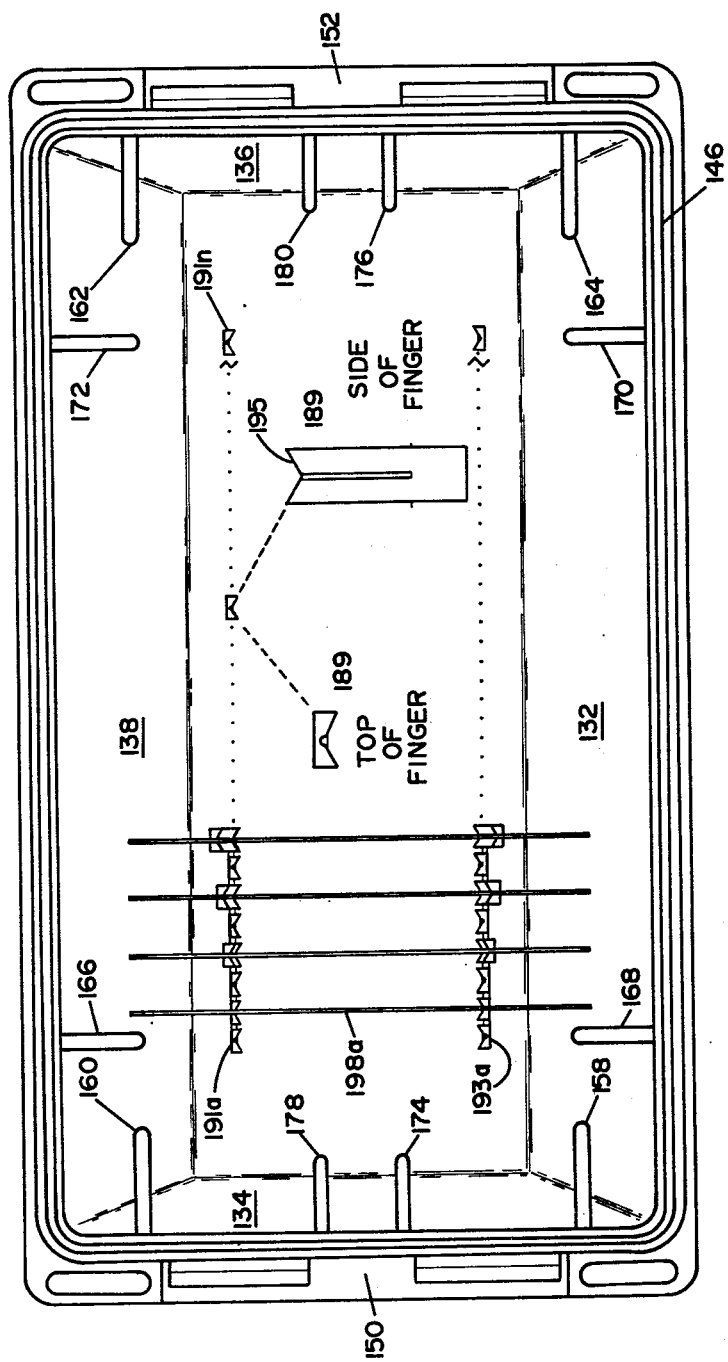
FIG. 6 illustrates a bottom view of the package top with a wafer engaged against opposing fingers.

Package top 18 includes a substantially horizontal top 130, substantially angulared sides 132, 134, 136, and 138, and male lip 140 including four-sided configured edge to insert, engage, and enter into the female trough 70 including the four like sides, lips 142, 144, 146, and 148, finger holes 150 and 152, end vertical members 158, 160, 162, and 164, side vertical members 166, 168, 170, and 172, and end support members 174, 176, 178, and 180. A like number of orthogonally positioned pairs of feet 182 and 184, 186 and 188, 190 and 192, 194 and 196, are about the four corners of the top 130. V-grooved fingers 191a-191n and 193a-193n including angular, rounded, grooved edges 195a-195n and 197a-197n protrude from top 30 downwardly to engage with the wafer edges at spaced opposed arcuate positions and are separately independent of each other with slits therebetween. Each finger includes a V-grooved rounded top, a V-grooved rounded channel edges, and slits between each finger as illustrated in FIG. 6.

FIG. 2 illustrates an end view of the middle portion of FIG. 1, cassette 12 illustrating the H-bar 26 and rod 28 thereon where like numerals correspond to those elements previously described. Sides 30 and 32 engage with members 88 and 90.

FIG. 3A illustrates a side view of the top and bottom portions of the feet of the mating corresponding packages where all numerals correspond to those elements previously described when the packages are stacked on top of each other.

FIG. 3B illustrates an end view corresponding to the mated and interengaged feet of the top and bottom packages of the wafer packages where all numerals correspond to those elements previously described. FIG. 3B is an end view of FIG. 3A. Like packages are positioned on top and bottom of the disclosed package by interlocking of the feet of the respective packages.

FIG. 4 illustrates a top view of the cassette 12 and the bottom package 14 looking downward with the two members 12 and 14 interengaged with respect to each other where all numerals correspond to those elements previously described. Representative wafers 198a–198n are illustrated as being engaged in the respective grooves of the cassette.

FIG. 5 illustrates a cross-sectional side view of the cassette 12, the top package 14 and the bottom package 16 illustrated with wafers 198a–198n shown. All numerals correspond to those elements previously described.

MODE OF OPERATION

FIG. 5 illustrates a side view of the package 10 including the cassette 12, the bottom package 14, and the top package 16 including a plurality of engaged wafers 198a–198n with all other numerals corresponding to those elements previously described. Particularly pointed out in the drawings is the interlocking and interengaging relationship of the cassette 12 with respect to the bottom package 14 and the top package 16 with the wafers 198 engaged between the cassette 12, the bottom 14, and the top 16. The wafer 198 is also engaged between the dividers and the fingers and limits and/or prohibits movement.

The lip engages into the trough, the hook ends latch about the holes, and the interengaging relationship between the cassette, the bottom package and the top package about wafers. This interengaging relationship particularly reflects that the package as a whole which reduces and eliminates contamination as well as providing a flush perimeter for taping of the top and bottom portions of the package 16 and 18 respectively, providing for secured shipping and storage.

FIG. 6, which illustrates a bottom view of the top 14, illustrates the principle and mode of operation of the fingers which not only secures the wafers, but also provides a spring action for popping of the top. A first wafer 198a is illustrated in an unactuated position against the top prior to the top 14 telescoping over the cassette 12 and the wafers. It is noted, by the way, that the cassette only goes in one way into the base 16 but that the cover 14 can be reversed in either direction over the cassette 12. When the top 14 is positioned against the wafers, the spring members exert pressure as the cover comes down.

As the top 14 centers over the wafers in the cassette tray, the cassette tray and the package bottom 16, the fingers uniformly space the wafers with respect to each other, with first contact between the fingers and the wafers. Second, the wafers engage the V-centers of the top of each finger, thereby aligning the wafers for prior movement into the fingers. Third, the fingers expand outwardly and fourth, the wafers engage within the rounded track in each of the opposing and aligned fingers. This first, second, third, and fourth action between the wafers and the fingers provide that the wafers are aligned within the rounded grooves of the fingers, providing that there is a slight spring action between the finger with respect to the wafer. The spring action secures a wafer within the cassette and also provides an upward pressure towards the package top with respect to the package bottom, so that when the latches are snapped open, such as by the latch key 199 which is exerted just above the finger hole over the top of the latch but below the bottom of the lip of the package top, the end of the package top is sprung upward by the action of the fingers against the wafers. Members 174, 176, 178, and 180 can also be referred to as bumper ribs which align the fingers with respect to the wafers over the cassette. The key 199 of FIG. 7 pries open one edge which flips open due to the non-friction engagement now in the spring engagement between the fingers and the wafers. The fingers which had inherently previously exerted pressure against the wafers are now free to react upwards as the latch is no longer holding the package top to the package bottom.

It is particularly important to note that the latches are flush, providing that the container is suitable not only of being taped but shrink-wrapped, some suitable type of polyester, polyethylene, or mylar film further providing a non-contaminable, closed container with structural integrity. This also reduces the cost of the container and maintains structural integrity of the wafers supported therein. The cassette with respect to the package top and package bottom engages with the respective components when the components are near frictional engagement of an entire package. Finally, a thin node line 97 is provided at one end of the package bottom 16 for alignment with a label which indicates the rearward end of the cassette providing for efficient handling and movement, thus eliminating lost time and motion.

FIG. 6 further illustrates the four positions of the wafer where the fingers space the wafers uniformly at the position 151 of the wafer just resting on the fingers, where the V-grooves at the top of each finger center on each wafer at position 153, where the fingers being slightly expanded with spring action at position 155, and where the wafer forces the fingers to expand outwardly with inherent spring action by the fingers at position 157. Position 157 is where the wafer is riding in the track of each finger where the track is rounded and has angulared sides as illustrated in FIG. 6.

Figure 7:
FIG. 7 illustrates a key for popping the package top.

FIG. 7 illustrates a view of a key 199 for inserting into the finger holes to the package 10 for opening of the top in lieu of interdigial action, and the inherent action of the fingers 191a–n and 193a–n provide for in effect "pop-up action" of the top from the bottom of the cassette in the fingers reacting against the wafers with the spring action.

FIRST ALTERNATIVE EMBODIMENT

Figure 8:
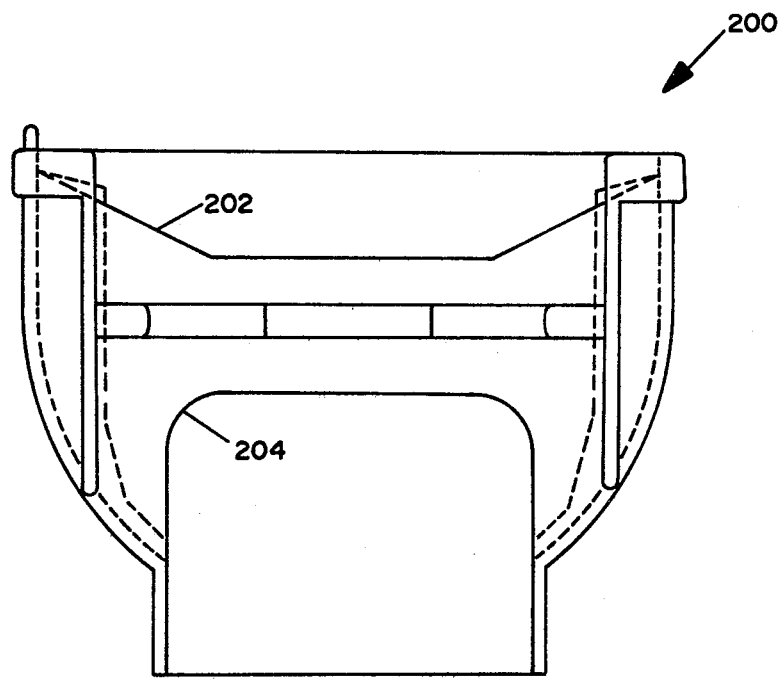
FIG. 8 illustrates a first additional embodiment of a cassette H-bar.

FIG. 8 illustrates an end view of a cassette 200 similar to that described previously in FIGS. 1–5 illustrating a slightly ramped portion 202 and a slightly rounded portion 204. All other structure corresponds to that previously described. The primary difference is that the ramp and rounded portions vary in angular differentiation with respect to that previously described in FIGS. 1–5 for a different and larger sized wafers.

SECOND ALTERNATIVE EMBODIMENT

Figure 9:
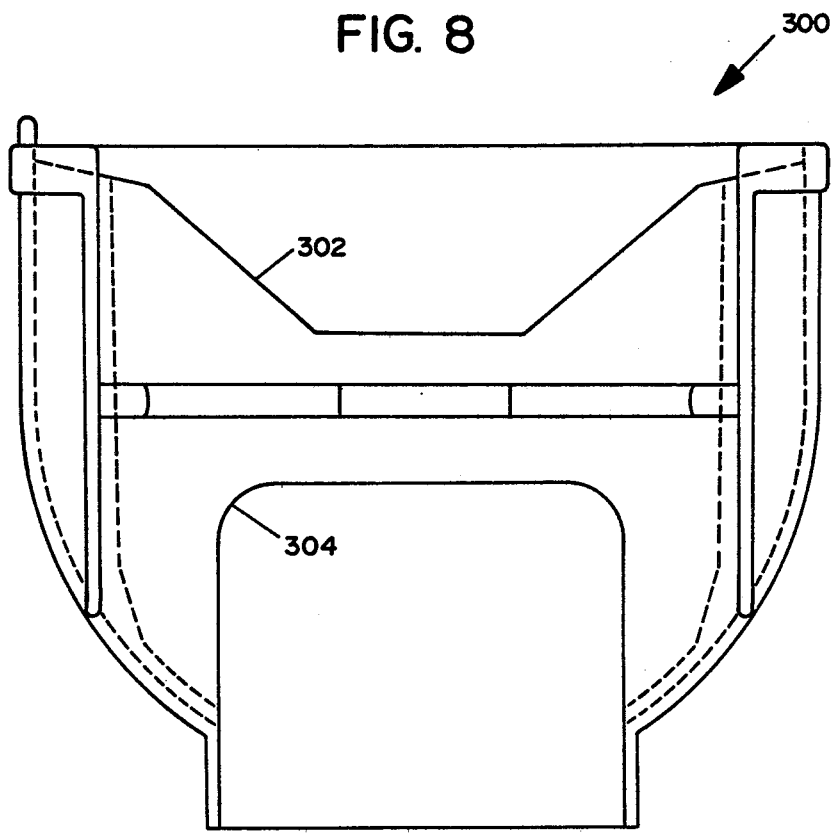
FIG. 9 illustrates a second additional embodiment of a cassette H-bar.

FIG. 9 illustrates a second alternative embodiment 300 of an end view of a cassette similar to that described with respect to FIGS. 1–5 where the ramped portion 302 and the rounded portion 304 are substantially similar but slightly different to that previously described for a larger size wafer. All other geometrical representations correspond to that previously described.

Various modifications can be made to the present invention without departing from the apparent scope thereof. While the wafer packages have been indicated to support from one to twenty-five wafers, the wafers can support any greater or lesser number as desired.

Having thus described the invention, what is claimed is:

1. Package for silicon wafers comprising:
   a. wafer cassette including opposing mirror-image curved sides, a plurality of vertically opposing outward extending dividers partitioning said cassette, a closed end, a substantially open H-bar configured end including a ramped top portion and a rounded bottom portion, and a partially segmented cylindrical support rod secured and positioned outward across said H-bar and including two mating buttons spaced thereon;
   b. package bottom including a bottom member, four slightly geometrically configured sides, female trough surrounding a top edge of said sides, opposing end hook latches with a finger hole including a hook on each side of each of said finger holes, internal geometrically configured vertical side and end positioning members extending outwardly and upwardly from interior sides and ends for positioning of said cassette, and four pairs of orthogonal feet at each edge of said bottom member thereof; and,
   c. package top including a top member, four angled sides surrounding said top, a male lip extending downwardly from said bottom of said sides for mating with each female trough, a plurality of opposing flexible independent fingers including a side groove and a top groove in each of said opposing fingers for perimeter contact mating with each wafer, internal geometrically configured vertical positioning members extending outwardly and downwardly from interior sides and ends for positioning of said cassette, hole indentations including outward extending latch on each side positioned on outer lower ends for receiving and latching said hooks of said package bottom, and a plurality of orthogonal pairs of feet on each outer top corner of said package top member whereby silicon wafers engage between said dividers of said cassette, between said cassette and said fingers of said package top, said cassette engages and interlocks between said vertical side and end members between said package top and package bottom, said package top lip engages into said package trough bottom, and said latches engage over said hook ends between said bottom and top package respectively, and said interlocking orthogonal feet providing for stacking of like packages, thereby providing secure and contamination-free environment for transportation and storage of silicon wafers and a smooth perimeter about said mated package top and bottom.

2. Package of claim 1 wherein said package top lip and top of said package bottom comprise a flush perimeter of a finite height surrounding the perimeter between the package top and said package bottom when said package top and package bottom are interengaged and mated with respect to each other.

3. Package of claim 1 wherein said cassette supports at least one to twenty-five wafers.

4. Package of claim 1 wherein said engaged opposing hook and said latch provide for a flush perimeter.

5. Package of claim 1 wherein each end of said package includes dual hooks and latches on opposing sides of a finger hole.

6. Package of claim 1 wherein said female trough and said male lip provide for a secure environment within said package top and package bottom which can be evacuated and support an inert atmosphere.

7. Package of claim 1 wherein each finger includes independent means providing spring action thereto on wafer edge contact.

8. Package of claim 1 wherein each finger includes a rounded V-grooved top and a grooved inside V-rounded member for engaging with an edge on wafer.

9. Package of claim 1 wherein each of said fingers is independently spaced with respect to each other including an independent slit between each of said fingers along each row of fingers.

10. Package of claim 1 wherein said fingers limit and secure movement of each of said wafers.

11. Package for silicon wafers comprising:
    a. wafer cassette means for housing a plurality of spaced wafers therein along a longitudinal distance and including forward indexing button means;
    b. package bottom for supporting said wafer cassette means in a spaced relationship therein and including female receiving trough means on a top edge thereof and flexible hook locking means projecting upwardly along opposing ends of said package bottom;
    c. package top for enclosing said package bottom and said wafer cassette means in a spaced relationship therein and including male lip means on a bottom edge extending downwardly therefrom and latch means extending outwardly from an edge for engaging said locking means; and,
    d. plurality of independent finger means extending downwardly in spaced opposing rows from an interior surface of said package top, said fingers providing for independent spacing and securing of each of said wafers in said cassette means, and between said package top and package bottom whereby said fingers secure edges of said wafers thereby preserving structural integrity of each of said wafers.

12. Package of claim 11 including means at said finger means for springing upward said package top from said package bottom when said hook and latch locking means are disengaged thereby disengaging said package top and package bottom about said lip means.

13. Package of claim 11 wherein each of said finger means includes an independent V-grooved top and an independent V-grooved side for independent spacing of said wafer by said top groove and securing said wafer by said side groove into said cassette means.

14. Package of claim 11 including slit means for independent operation of each of said fingers with respect to each other.

15. Package of claim 11 including means providing for a flush perimeter for shrink wrap.

16. Package of claim 11 including means providing for smooth contoured edges of said package for shrink wrap.

17. Package of claim 11 comprising dividers for twenty-five wafers.

18. Package of claim 11 comprising means in said package bottom for accepting said cassette means in only one indexed direction.

19. Package of claim 11 wherein said latching and hook means is equally flush with said trough-lip means.

20. Wafer cassette comprising: mirror-image curved sides, a substantially closed end, an open H-bar configured end including a ramped top portion and a rounded bottom portion, a partial cylindrical member secured across said H-bar and including locating buttons, one at either end, and a center enlarged cylindrical rod for structural support integrity, two vertical sides at opposing ends of said H-bar, and two substantially vertical lower edges secured to said curved sides whereby said H-bar including said cylindrical rod, two indexing buttons, and an enlarged cylindrical rod provide for machine indexing, cassette indexing, and structural integrity.

21. Package comprising:
a. package bottom including a bottom member, four slightly geometrically configured sides, female trough surrounding a top edge of said sides, opposing end hook latches with a finger hole including a hook on each side of each of said finger holes, internal geometrically configured vertical side and end positioning members extending outwardly and upwardly from interior sides and ends for positioning, and four pairs of orthogonal feet at each edge of said bottom member thereof; and,
b. package top including a top member, four angled sides surrounding said top, a male lip extending downwardly from said bottom of said sides for mating with said female trough, a plurality of opposing flexible independent fingers including a side groove and a top groove in each of said opposing fingers for perimeter contact mating with each wafer in a cassette placed into said package bottom, internal geometrically configured vertical position members extending outwardly and downwardly from interior sides and ends for positioning of a cassette, hole indentations including outward extending latch on each side positioned on outer lower ends for receiving and latching said hooks of said package bottom, and a plurality of orthogonal pairs of feet on each outer top corner of said package top member.

* * * * *